(12) United States Patent
Hughes (10) Patent No.: US 7,920,026 B2
(45) Date of Patent: Apr. 5, 2011

(54) AMPLIFIER OUTPUT STAGE WITH EXTENDED OPERATING RANGE AND REDUCED QUIESCENT CURRENT

(75) Inventor: Rodney Alan Hughes, Tacoma, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/099,099

(22) Filed: Apr. 7, 2008

(65) Prior Publication Data

US 2009/0251215 A1 Oct. 8, 2009

(51) Int. Cl.
*H03F 3/45* (2006.01)

(52) U.S. Cl. .......................................... 330/255; 330/257

(58) Field of Classification Search .................. 330/255, 330/257; 327/108
See application file for complete search history.

(56) References Cited

U.S. PATENT DOCUMENTS

| | | | |
|---|---|---|---|
| 3,795,825 A | 3/1974 | McGhee ........................ | 307/264 |
| 4,396,890 A | 8/1983 | Kato et al. ........................ | 330/86 |
| 5,036,527 A | 7/1991 | Halim et al. | |
| 5,189,421 A | 2/1993 | Daugherty ..................... | 341/157 |
| 5,233,309 A | 8/1993 | Spitalny et al. ................ | 330/86 |
| 5,339,454 A | 8/1994 | Kuo et al. | |
| 5,387,879 A | 2/1995 | Satoh ............................. | 330/86 |
| 5,481,225 A | 1/1996 | Lumsden et al. ............. | 330/254 |
| 5,507,023 A | 4/1996 | Suganuma et al. | |
| 5,512,859 A | 4/1996 | Moraveji | |
| 5,734,974 A | 3/1998 | Callaway, Jr. et al. | |
| 5,955,925 A | 9/1999 | Segawa et al. ................ | 330/279 |
| 6,020,785 A | 2/2000 | Allen et al. ....................... | 330/2 |
| 6,026,288 A | 2/2000 | Bronner | |
| 6,031,421 A | 2/2000 | McEwan ........................ | 330/10 |
| 6,198,349 B1 | 3/2001 | Kanno et al. .................. | 330/282 |
| 6,226,504 B1 | 5/2001 | Takagi | |
| 6,249,686 B1 | 6/2001 | Dvorkin et al. | |
| 6,294,958 B1 * | 9/2001 | Eschauzier ................... | 330/267 |
| 6,324,387 B1 | 11/2001 | Kamgar et al. | |
| 6,363,127 B1 | 3/2002 | Heinonen et al. | |

(Continued)

FOREIGN PATENT DOCUMENTS

DE 196 30 393 A1 1/1998

(Continued)

OTHER PUBLICATIONS

Wooley, "Cascaded Noise-Shaping Modulators for Oversampled Data Conversion," Custom Integrated Circuits Conference, Proceedings of IEEE 2003, Sep. 21-24, 2003, pp. 113-114.

(Continued)

*Primary Examiner* — Robert Pascal
*Assistant Examiner* — Khiem D Nguyen (57) ABSTRACT

An output stage of an amplifier circuit includes one or more output transistors that are selectively driven by a boosted drive circuit, where the boosted drive circuit is arranged such that the output range of the amplifier circuit is increased while maintaining reduced quiescent current. The drive signal to each output transistor is selectively increased only when demanded by the output load conditions. The threshold for boosting the drive signal can be adjusted for optimized performance. In one example, a class AB output stage includes a separate drive boost circuit for each output transistor. For this example, each drive boost circuit has a separate threshold for boosting each of the drive signals to the output transistors. The boosting can also be adjusted to optimize the differential input stage and current mirror maximum current requirement while maintaining minimum required bias currents.

24 Claims, 6 Drawing Sheets

U.S. PATENT DOCUMENTS

| | | |
|---|---|---|
| 6,396,934 B1 | 5/2002 | Federspiel .................. 381/100 |
| 6,804,501 B1 | 10/2004 | Bradley et al. |
| 6,822,696 B2 | 11/2004 | Talmola et al. |
| 6,885,852 B2 | 4/2005 | Hughes et al. |
| 6,937,675 B2 | 8/2005 | Seo |
| 6,961,552 B2 | 11/2005 | Darabi et al. |
| 6,994,427 B2 | 2/2006 | Oishi |
| 7,102,440 B2 | 9/2006 | Damitio et al. .............. 330/267 |
| 7,313,377 B2 | 12/2007 | Kansy |
| 7,352,242 B1 | 4/2008 | Hughes ........................ 330/254 |
| 2003/0207675 A1 | 11/2003 | Hughes et al. |
| 2005/0024129 A1 | 2/2005 | Jang ............................. 327/541 |
| 2005/0225393 A1 | 10/2005 | Lee et al. ..................... 330/284 |
| 2005/0285674 A1 | 12/2005 | Zaguri ......................... 330/254 |
| 2006/0093153 A1 | 5/2006 | Yamamoto et al. ............ 381/59 |
| 2006/0181343 A1 | 8/2006 | Moon et al. .................... 330/86 |

FOREIGN PATENT DOCUMENTS

| | | |
|---|---|---|
| EP | 0 091 160 A1 | 10/1983 |
| EP | 0 366 485 A2 | 5/1990 |
| EP | 0 495 302 A2 | 7/1992 |
| EP | 0 571 075 A2 | 11/1993 |
| EP | 0 571 075 A3 | 11/1993 |
| EP | 1 0001 527 A2 | 5/2000 |
| JP | 57 125507 A | 8/1982 |
| JP | 58 124310 A | 7/1983 |
| JP | 63 132510 A | 6/1988 |
| WO | WO 99/30426 A1 | 6/1999 |
| WO | WO 99/63661 | 12/1999 |
| WO | WO 00/18023 A1 | 3/2000 |

OTHER PUBLICATIONS

Cheung et al., "An FPGA-based re-configurable 24-bit 96kHz sigma-delta audio DAC," Field-Programmable Technology, 2003 Proceedings. 2003 *IEEE* International Conference on Dec. 15-17, 2003, pp. 110-117.

Tim Wescott, "Sigma-delta techniques extend DAC resolution" Jun. 23, 2004, *CMP Media LLC 2005*, http://www.embedded.com/showArticle.jhtml?articleID=22101730 (5 pgs).

* cited by examiner

AMPLIFIER OUTPUT STAGE WITH EXTENDED OPERATING RANGE AND REDUCED QUIESCENT CURRENT

FIELD OF THE INVENTION

The present disclosure generally relates to output stages in amplifier circuits. More particularly, the present disclosure relates to a technique for increasing the output range in an amplifier circuit while maintaining reduced quiescent current by selectively boosting the drive signal to the output transistors.

BACKGROUND

An integrated amplifier circuit is typically constructed from a small chip of semiconductor material upon which an array of active/passive components have been constructed and connected together to form a functioning circuit. Integrated amplifier circuits are generally encapsulated in a plastic housing (chip) with signal, power supply, and control leads or pins accessible for connection to external electronic circuitry. Input signals, which are received by the integrated amplifier circuit through input pins, are processed by active and/or passive components in different amplifier stages (e.g., input stage, turn-around stage, and output stage). The output stage of the amplifier is responsible for driving the amplifiers load through the external pins of the integrated circuit.

Amplifier circuits with wide output signal ranges require that the output voltage supplied by the output stage approaches the power supply limits (or rails) under various output loading conditions while maintaining satisfactory performance characteristics. In bipolar junction transistor (BJT) designs, the performance characteristics are influenced by transistor's collector bias current (Ic), collector-to-base voltage operating point (Vbe), temperature, and other factors resulting from the semiconductor manufacturing process. The amplifier circuits loading requirements and output voltage ranges are generally determined by the output transistor's terminal voltages, such as the transistors minimum collector-emitter voltage (Vce-min), base-collector junction voltage (Vbc), and worst case base drive current (Ib). The required quiescent current (IQ) for the transistors in the output stage are typically dictated by the worst case region of operation for the amplifier's performance.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments are described more fully below with reference to the accompanying drawings, which form a part hereof, and which show specific exemplary embodiments. However, embodiments may be implemented in many different forms and should not be construed as limited to the embodiments set forth herein; rather, these embodiments are provided so that this disclosure will be thorough and complete, and will fully convey the scope. Embodiments may be practiced as methods, systems, circuits or devices. The various embodiments will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electromagnetic, mechanical, logical, or other connection between the items connected, without any electrical, mechanical, logical or other intermediary therebetween. The term "coupled" can mean a direct connection between items, an indirect connection through one or more intermediaries, or communication between items in a manner that may not constitute a connection. The term "circuit" can mean a single component or a plurality of components, active and/or passive, discrete or integrated, that are coupled together to provide a desired function. The term "signal" can mean at least one current, voltage, charge, data, or other such identifiable quantity Briefly stated, the present disclosure generally relates to increasing the output range of an amplifier circuit while maintaining reduced quiescent current by selectively boosting the drive signal to one or more output transistors in the output stage of the amplifier. The drive signal to each output transistor is selectively increased only when demanded by the output load conditions. The threshold for boosting the drive signal can be adjusted for optimized performance. In one example, a class AB output stage includes a separate drive boost circuit for each output transistor. For this example, each drive boost circuit has a separate threshold for boosting each of the drive signals to the output transistors. The boosting can also be adjusted to optimize the differential input stage and current mirror maximum current requirement while maintaining minimum required bias currents.

Bipolar transistors can have varying amounts of gain (Beta) that result as a consequence of processing variations, temperature changes, and other circuit driven operating conditions. In order to ensure high output signal swings in the output stage of an amplifier circuit, the operating conditions for the output stage must be carefully analyzed. For example, the amount of base current (Ib) required for a BJT in an output stage may need to be increased to satisfy increased loading conditions, while the amount of base current may need to be decreased when light loading conditions exist.

As the signal swing of the output stage begins to approach the power supply limits (either high supply or low supply), the output transistors may begin to exhaust their available headroom. For example, the minimum voltage is required across the collector and emitter terminals of a transistor (VCE), also known as the minimum saturation voltage or VCE-SAT(min). A high magnitude for VCE-SAT(min) can reduce the available headroom before signal distortion or clipping may occur in the output signal. The minimum saturation voltage is a function of the biasing conditions of the transistor (e.g., the base current), the environmental operating conditions of the transistor, and the processing driven gain of the transistor.

As the output signal swing in the output stage approaches the power supply limits, the gain of the amplifier decreases as a consequence of the above-described, an other, limitations of the output transistors. In the presently described system, method and apparatus, the useable gain of the amplifier over the desired operating frequency range (or Bandwidth) is compensated by increasing the base drive to the output transistors as will be described below.

Figure 1:
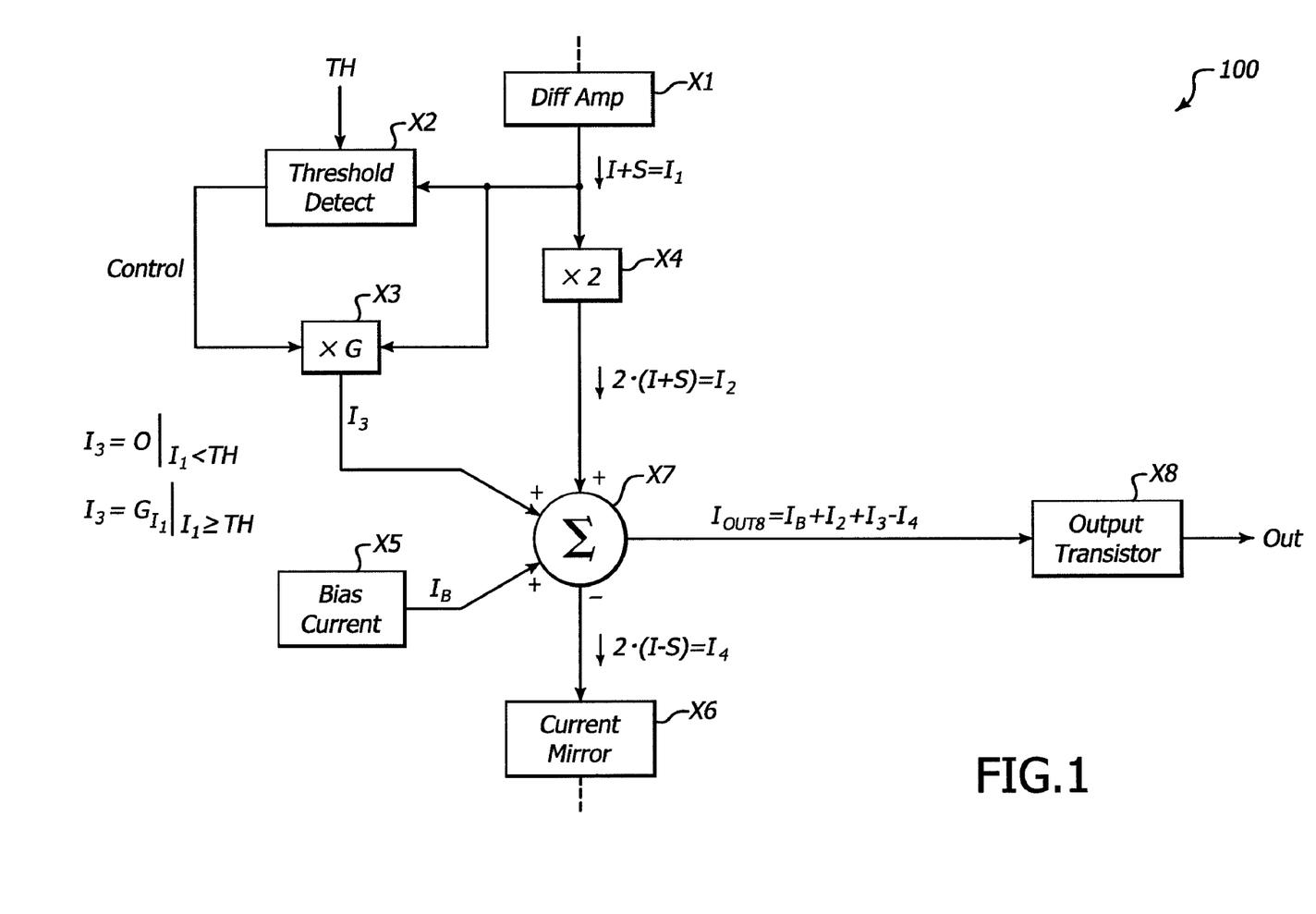
FIG. 1 is a block diagram illustrating an example output stage in an amplifier that includes an extended output range, arranged in accordance with at least some aspects of the present disclosure.

FIG. 1 is a block diagram illustrating an example output stage (100) in an amplifier that includes an extended output range, arranged in accordance with at least some aspects of the present disclosure. The output stage (100) includes a differential amplifier block (X1), a threshold detector block (X2), a first gain block (X3), a second gain block (X4), a bias current block (X5), a current mirror block (X6), a summer block (X7), and an output transistor block (X8).

An output of the differential amplifier block (X1) is a first current (I1) that has a magnitude corresponding to the quantity (I+S), where I is a DC current portion from the amplifier, and S is the signal varying portion from the amplifier. The threshold detector block (X2) is arranged to evaluate the first current (X1) and compare it to a threshold (TH). When the magnitude of the first current (I1) is below the threshold (TH), the threshold detector circuit disables the first gain block (X3). When the magnitude of the first current (I1) is above the threshold (TH), the threshold detector circuit enables the first gain block (X3), which then provides a third current (I3) that is a function of the first current (I1) as given by: $I3=G_{f1}$. The third current is coupled to a first additive (+) input of the summer block (X7).

The second gain block (X4) is arranged to provide a second current (I2) that is proportional to the first current (I1) as given by: $I2=2*I1$. The resulting magnitude of the second current (I2) corresponds to $I2=2*(I+S)$. The second current (I2) is coupled to a second additive (+) input of the summer block (X7). The bias current block (X5) is arranged to generate a nominal biasing current (IB), which is coupled to a third additive (+) input of the summer block (X7). The current mirror block (X6) is arranged to subtract a fourth (I4) current from the subtractive (−) input of the summer block (X7), where the fourth current is given by: $I4=2*(I-S)$.

The output of the summer block drives a biasing current (IOUTB) to a biasing input of the output transistor (X8). The biasing current is determined from the various inputs of the summer block as: $IOUTB=IB+I2+I3-I4$. Substituting for I2 and I4 yields: $IOUTB=IB+I3+2*(I+S)-2*(I-S)$. Consolidating terms, the biasing current (IOUT) is given as: $IOUT=IB+I3+4*S$. As described earlier, the third current (I3) is equal to zero when the first current (I1) is below threshold TH, which means that $IOUT=IB+4*S$ under this condition. However, when the first current (I1) exceeds the threshold (TH), $IOUT=IB+4*S+G_{f1}$. It can thus be seen that the biasing current to the output transistor is boosted when the first current (I1) exceeds the threshold (TH).

The gain multiplier of the second gain block (X2) is illustrated as a gain of two (2), but any other appropriate gain may be selected as long as an equal gain factor is reflected by the subtractive (−) input of the summer block (X7). In other words, when I2 is determined as $I2=W*(I+S)$, I4 should be given determined as $I4=W*(I+S)$. In such an example, the biasing current (IOUT) is given as: $IOUT=IB+I3+2*W*S$.

Figure 2:
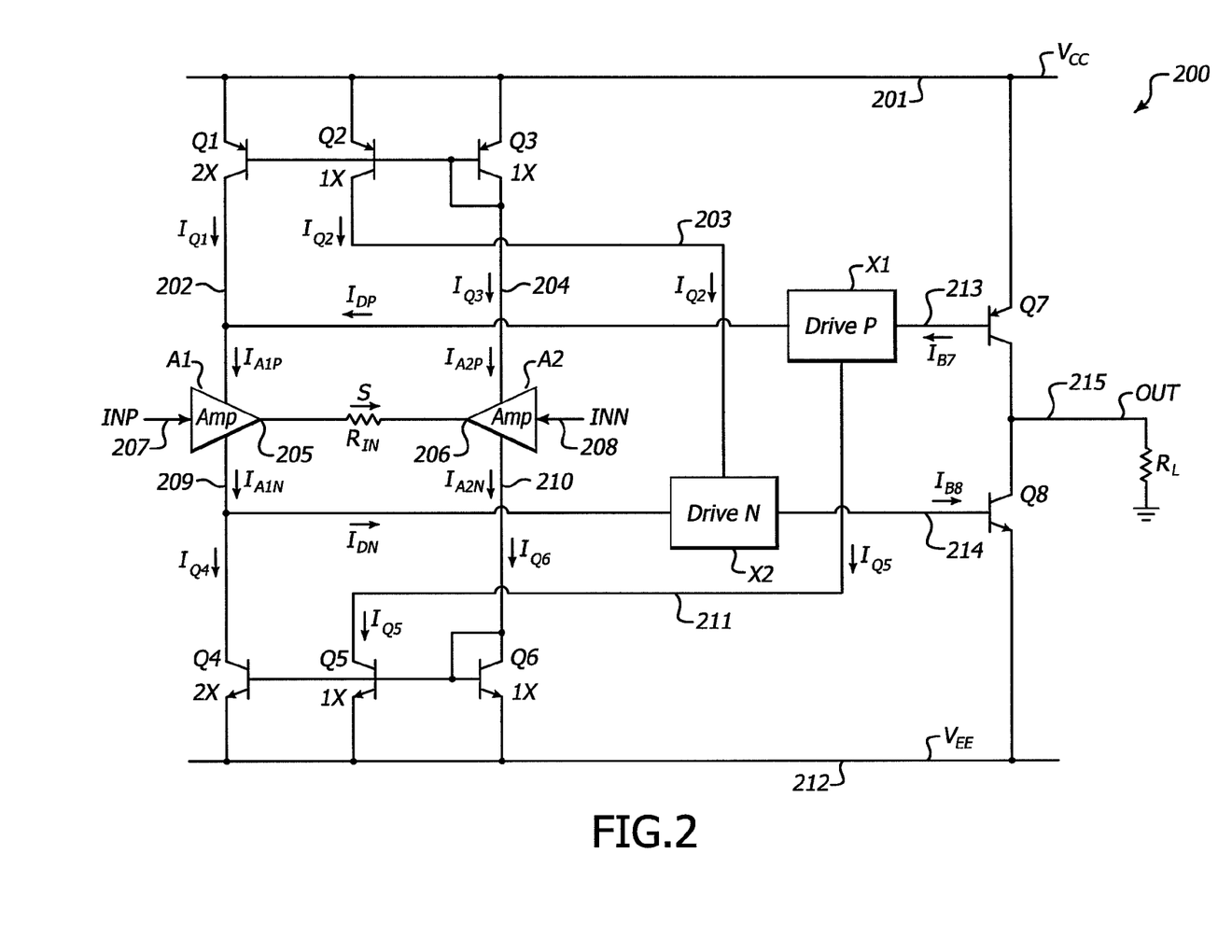
FIG. 2 is a schematic diagram illustrating an example output stage circuit with an extended output range, arranged in accordance with at least some aspects of the present disclosure.

FIG. 2 is a schematic diagram illustrating an example output stage circuit (200) with an extended output range, arranged in accordance with at least some aspects of the present disclosure. Output stage circuit 200 includes transistors Q1-Q8, amplifier circuits A1-A2, resistors RIN and RL, and drive circuits X1-X2.

Transistors Q1, Q2 and Q3 are configured with common base-emitters, where transistors Q2 and Q3 have equal transistor areas (1:1 ratioed, or 1X each), and transistor Q1 has a transistor area that is twice (2×) the relative area of either of transistors Q2 or Q3. Transistor Q1 has an emitter terminal coupled to node 201, a base terminal coupled to node 204, and a collector terminal coupled to node 202. Transistor Q2 has an emitter terminal coupled to node 201, a base terminal coupled to node 204, and a collector terminal coupled to node 203. Transistor Q3 is a configured in a diode arrangement with an emitter terminal coupled to node 201, a base terminal coupled to node 204, and a collector terminal coupled to node 204.

Transistors Q4, Q5 and Q6 are also configured with common base-emitters, where transistors Q5 and Q6 have equal transistor areas (1:1 ratioed, or 1× each), and transistor Q4 has a transistor area that is twice (2×) the relative area of either of transistors Q5 or Q6. Transistor Q4 has an emitter terminal coupled to node 212, a base terminal coupled to node 210, and a collector terminal coupled to node 209. Transistor Q5 has an emitter terminal coupled to node 212, a base terminal coupled to node 210, and a collector terminal coupled to node 211. Transistor Q6 is a configured in a diode arrangement with an emitter terminal coupled to node 212, a base terminal coupled to node 210, and a collector terminal coupled to node 210.

Transistor Q7 includes an emitter coupled to node 201, a base coupled to node 213, and a collector coupled to node 215. Transistor Q8 includes an emitter coupled to node 212, a base coupled to node 214, and a collector coupled to node 215. Resistor RL is coupled between node 215 and a circuit ground (GND).

Amplifier circuit A1 includes an input terminal at node 207, a voltage output terminal at node 205, a first current terminal at node 202, and a second current terminal at node 209. Amplifier circuit A2 includes an input terminal at node 208, a voltage output terminal at node 206, a first current terminal at node 204, and a second current terminal at node 210. Resistor RIN is coupled between nodes 205 and 206.

Drive circuit X1 (DRIVE P) includes a first current input terminal at node 202, a second current input terminal at node 211, and a current output terminal at node 213. Drive circuit X2 (DRIVE N) includes a first current input terminal at node 209, a second current input terminal at node 203, and a current output terminal at node 214.

In operation, a high power supply voltage (VCC) is applied to node 201, a low power supply voltage (VEE) is applied to node 212, and a differential input signal (INP, INN) is applied across nodes 207 and 208. Transistors Q1-Q3 are arranged as a two output current mirror, where transistor Q3 senses the current flow (IQ3) in the second amplifier circuit (A2) at node 204, transistor Q1 provide the current (IQ1=2*IQ3) to the first amplifier circuit (A1) and the first drive circuit (X1) at node 202, and transistor Q2 provides the current input (IQ2=1*IQ3) to drive circuit X2 at node 203. Transistors Q4-Q6 are arranged as another two output current mirror, where transistor Q6 senses the current flow (IQ6) in the second amplifier circuit (A2) at node 210, transistor Q4 provide the current (IQ4=2*IQ6) to the first amplifier circuit (A1) and the second driver circuit (X2) at node 209, and transistor Q5 provides the current input (IQ5=1*IQ6) to drive circuit X1 at node 211.

The current flow in amplifier circuits A1 and A2 are determined by the DC biasing current (I) for the amplifier circuits, and an output signal current (S) which is responsive to the differential input signal (INP, INN) applied across nodes 207 and 208 (i.e., S=f(INP−INN)). The current flowing through the high supply terminal of amplifier circuit A1 corresponds to IA1P, where IA1P=(I+S). The current flowing through the low supply terminal of amplifier circuit A1 corresponds to IA1N, where IA1N=(I−S). Similarly, the current flowing through the high supply terminal of amplifier circuit A2 corresponds to IA2P, where IA2P=(I−S), and the current flowing through the low supply terminal of amplifier circuit A2 corresponds to IA2N, where IA2N=(I+S).

The first current input (IDP) to drive circuit X1 at node 202 is responsive to the differential input signal as IDP=[IA1P−(2*IA2P)]=(−I+3*S), where the 2× factor is from the 2× transistor Q1, where I is determined by the DC or bias current portion and S is determined by the difference between INP and INN. Similarly, the first current input (IDN) to drive circuit X2 at node 209 is responsive to the differential input signal as [IA1N−(2*IA2N)]=[−I−(3*S)], where the 2× factor is from the 2× transistor Q4. The second current input to drive circuit X1 at node 211 is responsive to another current input signal (IQ5) from transistor Q5, where IQ5=IA2N=(I+S). The second current input to drive circuit X2 at node 203 is similarly responsive to yet another current input signal (IQ2) from transistor Q2, where IQ2=IA2P=(I−S).

The first drive circuit (X1) is arranged to combine currents similar to the summer block of FIG. 1, where the base current (IB7) for output transistor Q7 is determined by: IB7−IDP−IBP−IQ5−IBOOSTP=0. IBP is the nominal biasing current for transistor Q7, and IBOOSTP is the boosted current which varies based on various operating conditions. As described previously above, the first current input (IDP) has a value given as IDP=(−I+3*S) and the current from transistor (Q5) is has a value given as IQ5=(I+S). Therefore, the base current (IB7) for transistor Q7 can be simplified as: IB7=IBP+IBOOSTP+4*S. The boost current (IBOOSTP) varies based upon whether or not the sensed current, IQ5=(I+S), has exceeded a threshold (e.g., THP). The boost current is zero (IBOOSTP=0) when the current magnitude for (I+S) is detected as below the requisite threshold (e.g., THP) for boosting the drive to output transistor Q7. When the current magnitude for (I+S) is detected as exceeding the requite threshold (e.g., THP), then the boosted current is given as: IBOOSTP=GP$_{(I+S)}$, where GP corresponds to the gain factor for base current boosting to transistor Q7 as a function of the quantity (I+S). Thus, the base current (IB7) for transistor Q7 corresponds to IB7=[IBP+(4*S)] for non-boosted conditions, and further corresponds to IB7=[IBP+(4*S)+GP$_{(I+S)}$] for boosted conditions.

The second drive circuit (X2) is arranged to combine currents similar to the summer block of FIG. 1, where the base current (IB8) for output transistor Q8 is determined by: IDN+IBN+IQ2+IBOOSTN−IB8=0. IBN is the nominal biasing current for transistor Q8, and IBOOSTN is the boosted current which varies based on various operating conditions. As described previously above, the first current input (IDN) has a value given as IDN=[−I−(3*S)], and the current from transistor (Q2) is has a value given as IQ2=(I−S). Therefore, the base current (IB8) for transistor Q8 can be simplified as: IB8=IBN+IBOOSTN−4*S. The boost current (IBOOSTN) varies based upon whether or not the sensed current, IQ2=(I−S), has exceeded a threshold (e.g., THN). The boost current is zero (IBOOSTN=0) when the current magnitude for (I−S) is detected as below the requisite threshold (e.g., THN) for boosting the drive to output transistor Q8. When the current magnitude for (I−S) is detected as exceeding the requite threshold (e.g., THN), then the boosted current is given as: IBOOSTN=GN$_{(I−S)}$, where GN corresponds to the gain factor for base current boosting to transistor Q8 as a function of the quantity (I−S). Thus, the base current (IB8) for transistor Q8 is give as IB8=[IBN−(4*S)] for non-boosted conditions, and IB8=[IBN−(4*S)+GN$_{(I−S)}$] for boosted conditions.

In some example implementations, metal-oxide semiconductor (MOS) devices for one or more devices in circuit 200 in lieu of BJT devices. For example, transistors Q1, Q2 and Q3 can be replaced with a MOS type of transistor without departing from the present disclosure. In this example, the W/L ratio of transistor Q1 is twice that of either Q2 or Q4, which have matched W/L ratios. Similarly, transistors Q4, Q5 and Q6 can be replaced with MOS transistors, where the W/L ratio of transistor Q4 is twice that of either Q5 or Q6, which have matched W/L ratios.

Figure 3:
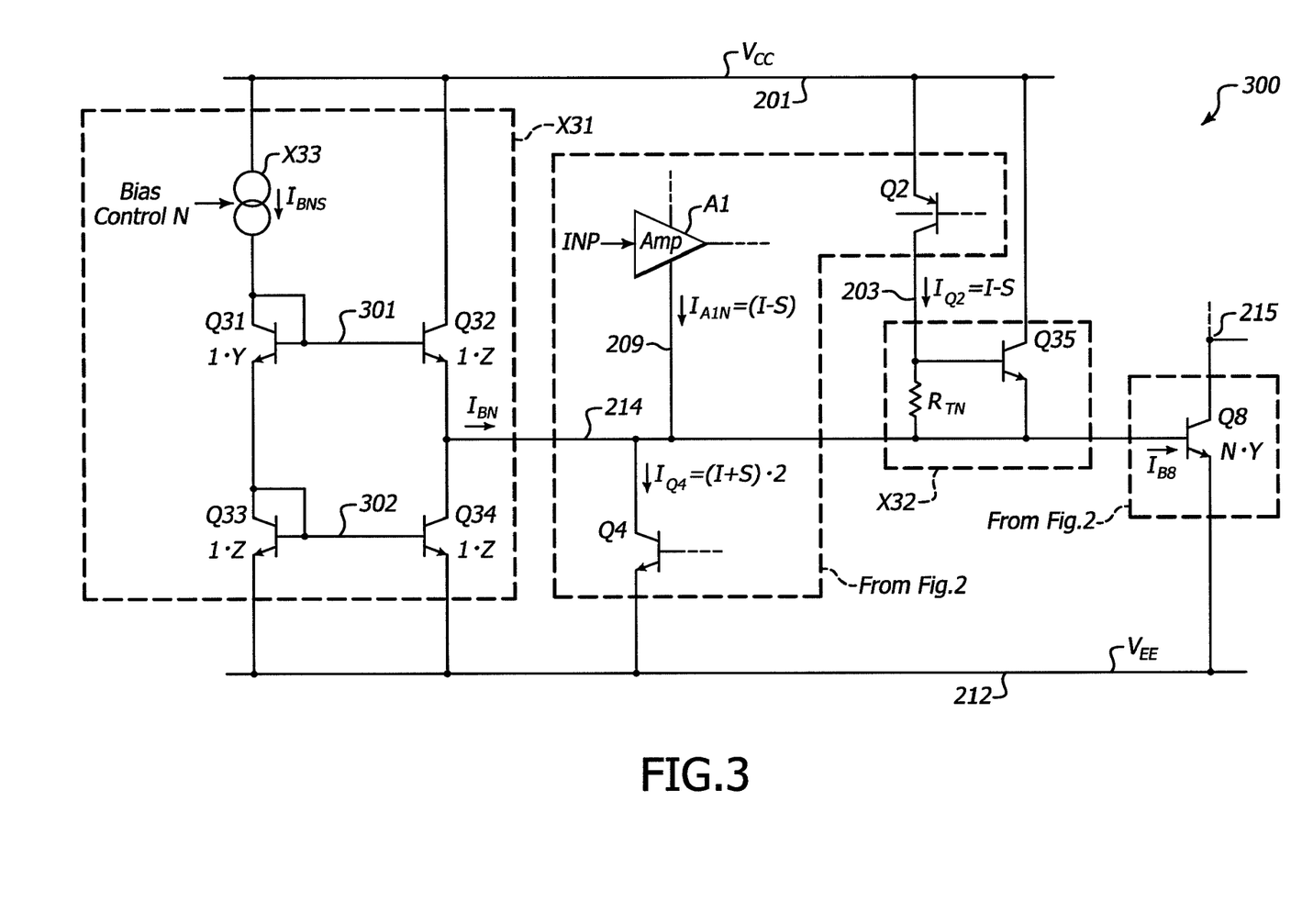
FIG. 3 is a schematic diagram illustrating a further detailed example of the DRIVE N block for the circuit of FIG. 2, arranged in accordance with at least some aspects of the present disclosure.

FIG. 3 is a schematic diagram illustrating a further detailed example of the DRIVE N block (300) for the circuit of FIG. 2, arranged in accordance with at least some aspects of the present disclosure. The DRIVE N block (300) comprises a biasing circuit (X31) and a combined threshold detection and base current boost circuit (X32). Node 214 and node 209 are shorted together in this described implementation.

Biasing circuit X31 includes transistors Q31-Q34 and a current source X33. Current source X33 is coupled between node 201 and node 301. Transistor Q31 is a diode configured transistor, with an area of 1*Y, that includes a base coupled to node 301, a collector coupled to node 301, and an emitter coupled to node 302. Transistor Q32 has an area of 1*Z, and includes a base coupled to node 301, a collector coupled to node 201, and an emitter coupled to node 214. Transistor Q33 is a diode configured transistor, with an area of 1*Z, that includes a base coupled to node 302, a collector coupled to node 302, and an emitter coupled to node 212. Transistor Q34 has an area of 1*Z, and includes a base coupled to node 302, a collector coupled to node 214, and an emitter coupled to node 212.

The combined threshold detection and base current boost circuit (X32) includes transistor Q35 and resistor RTN. Resistor RTN is coupled between node 203 and 214. Transistor Q35 has a base coupled to node 203, a collector coupled to node 201, and an emitter coupled to node 214.

In operation, the biasing circuit (X31) is arranged to generate a nominal biasing current (IBN) for transistor Q8. The nominal biasing current is proportional to the current (IBNS) provided by current source X33, which can be adjusted by a biasing control signal (BIAS CONTROL N). Current IQ2 from transistor Q2, which is given as (I−S), flows through resistor RTN to node 214. When the current flowing through resistor RTN is low, very little voltage will develop across the resistor (RTN) and transistor Q35 will be in a cut-off condition (IQ35=0). However, transistor Q35 will become forward biased when sufficient current flows through resistor RTN. Once the biasing voltage for transistor Q35 exceeds its threshold voltage (VRTN>VTH35), the current from transistor Q35 will be given as: IQ35=GN$_{(I−S)}$=Beta35*(1+IB35). Beta35 is the forward conduction gain for transistor Q35, and IB35 corresponds to the base current for transistor Q35. The base current for transistor Q35 is determined by the threshold voltage of the transistor (which is temperature and process dependent), the forward biasing voltage across the base-emitter junction from resistor RTN*(I−S), and operating point conditions for transistor Q35. The total current resulting from transistors Q2 and Q35 is therefore given as: IQ2+IQ35=(I−S)+GN$_{(I-S)}$.

In some example implementations, metal-oxide semiconductor (MOS) devices for one or more devices in circuit 300 in lieu of BJT devices. For example, transistor Q35 can be replaced with a MOS type of transistor without departing from the present disclosure. In this example, IQ35 will be determined from the drain current of a MOS transistor instead of an emitter current for a BJT device. The drain current for transistor Q35 is determined by the threshold voltage of the transistor (which is temperature and process dependent), the forward biasing voltage across the gate-source terminals from resistor RTN*(I+S), and operating point conditions for transistor Q35.

Output transistor Q8 can be scaled by a factor of N in size (e.g., N*Y) relative to the biasing transistors Q31 (1*Y) such that the effects of temperature, process, and power supply variations on the nominal biasing current (IBN) are matched as closely as possible to those for transistor Q8.

Figure 4:
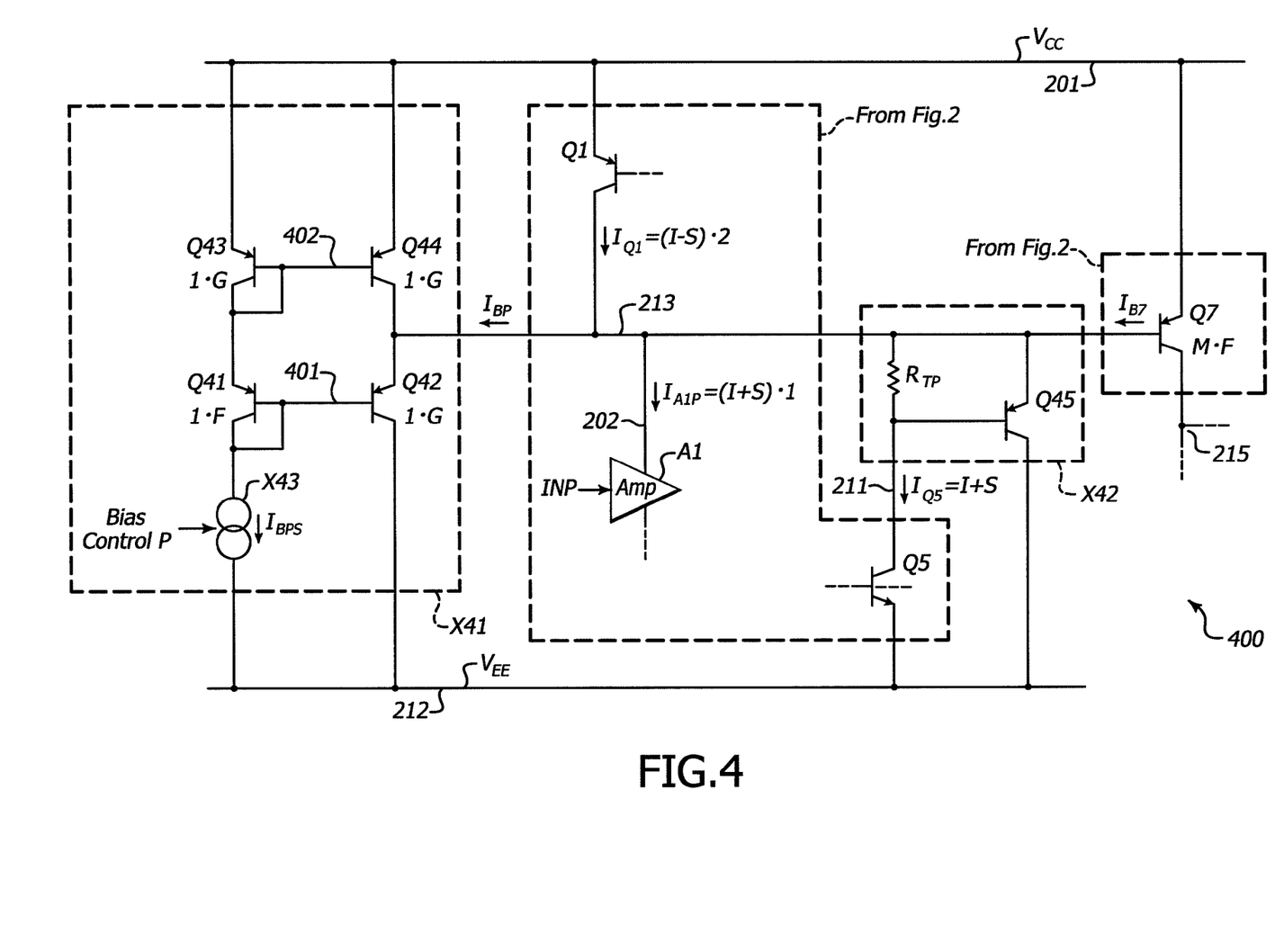
FIG. 4 is a schematic diagram illustrating a further detailed example of the DRIVE P block for the circuit of FIG. 2, arranged in accordance with at least some aspects of the present disclosure.

FIG. 4 is a schematic diagram illustrating a further detailed example of the DRIVE P block for the circuit of FIG. 2, arranged in accordance with at least some aspects of the present disclosure. The DRIVE P block (400) comprises a biasing circuit (X41) and a combined threshold detection and base current boost circuit (X42). Node 213 and node 202 are shorted together in this described implementation.

Biasing circuit X41 includes transistors Q41-Q44 and a current source X43. Current source X43 is coupled between node 401 and node 212. Transistor Q41 is a diode configured transistor, with an area of 1*F., that includes a base coupled to node 401, a collector coupled to node 401, and an emitter coupled to node 402. Transistor Q42 has an area of 1*G, and includes a base coupled to node 401, a collector coupled to node 401, and an emitter coupled to node 213. Transistor Q43 is a diode configured transistor, with an area of 1*G, that includes a base coupled to node 402, a collector coupled to node 402, and an emitter coupled to node 412. Transistor Q44 has an area of 1*G, and includes a base coupled to node 402, a collector coupled to node 213, and an emitter coupled to node 201.

The combined threshold detection and base current boost circuit (X42) includes transistor Q45 and resistor RTP. Resistor RTP is coupled between node 211 and 213. Transistor Q45 has a base coupled to node 211, a collector coupled to node 212, and an emitter coupled to node 213.

In operation, the biasing circuit (X41) is arranged to generate a nominal biasing current (IBP) for transistor Q7. The nominal biasing current is proportional to the current (IBPS) provided by current source X43, which can be adjusted by a biasing control signal (BIAS CONTROLP). Current IQ5 from transistor Q5, which is given as (I+S), flows through resistor RTP from node 213. When the current flowing through resistor RTP is low, very little voltage will develop across the resistor (RTP) and transistor Q45 will be in a cut-off condition (IQ45=0). However, transistor Q45 will become forward biased when sufficient current flows through resistor RTP. Once the biasing voltage for transistor Q45 exceeds its threshold voltage (|VRTP|>|VTH45|), the current from transistor Q45 will be given as: IQ45=GP$_{(I+S)}$=Beta45*(1+IB45). Beta45 is the forward conduction gain for transistor Q45, and IB45 corresponds to the base current for transistor Q45. The base current for transistor Q45 is determined by the threshold voltage of the transistor (which is temperature and process dependent), the forward biasing voltage across the base-emitter junction from resistor RTP*(I+S), and operating point conditions for transistor Q45. The total current resulting from transistors Q5 and Q45 is therefore given as: IQ5+IQ45=(I+S)+GP$_{(I+S)}$.

In some example implementations, metal-oxide semiconductor (MOS) devices for one or more devices in circuit 300 in lieu of BJT devices. For example, transistor Q35 can be replaced with a MOS type of transistor without departing from the present disclosure. In this example, IQ35 will be determined from the drain current of a MOS transistor instead of an emitter current for a BJT device. The drain current for transistor Q35 is determined by the threshold voltage of the transistor (which is temperature and process dependent), the forward biasing voltage across the gate-source terminals from resistor RTN*(I+S), and operating point conditions for transistor Q35.

Output transistor Q7 can be scaled by a factor of M in size (e.g., M*F) relative to the biasing transistors Q41 (1*F) such that the effects of temperature, process, and power supply variations on the nominal biasing current (IBP) are matched as closely as possible to those for transistor Q7.

Figure 5:
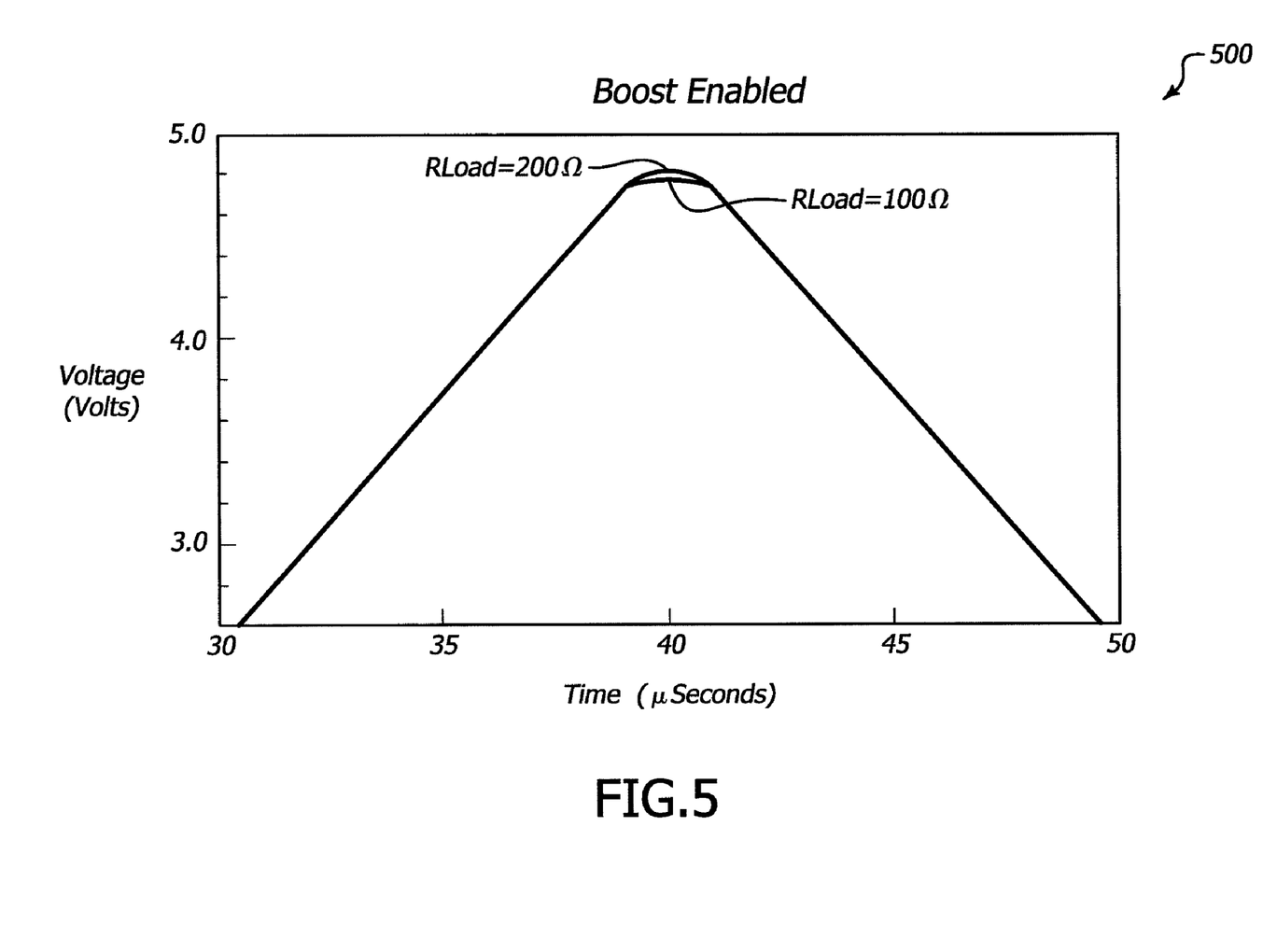
FIG. 5 is graphical diagram illustrating a performance of an example output stage circuit with extended output range when base current boosting is activated.

FIG. 5 is graphical diagram illustrating a performance of an example output stage circuit with extended output range when base current boosting is activated. As noted by the graph (500), the current continues to increase as the effect of the load is increased from 200 ohms to 100 ohms.

Figure 6:
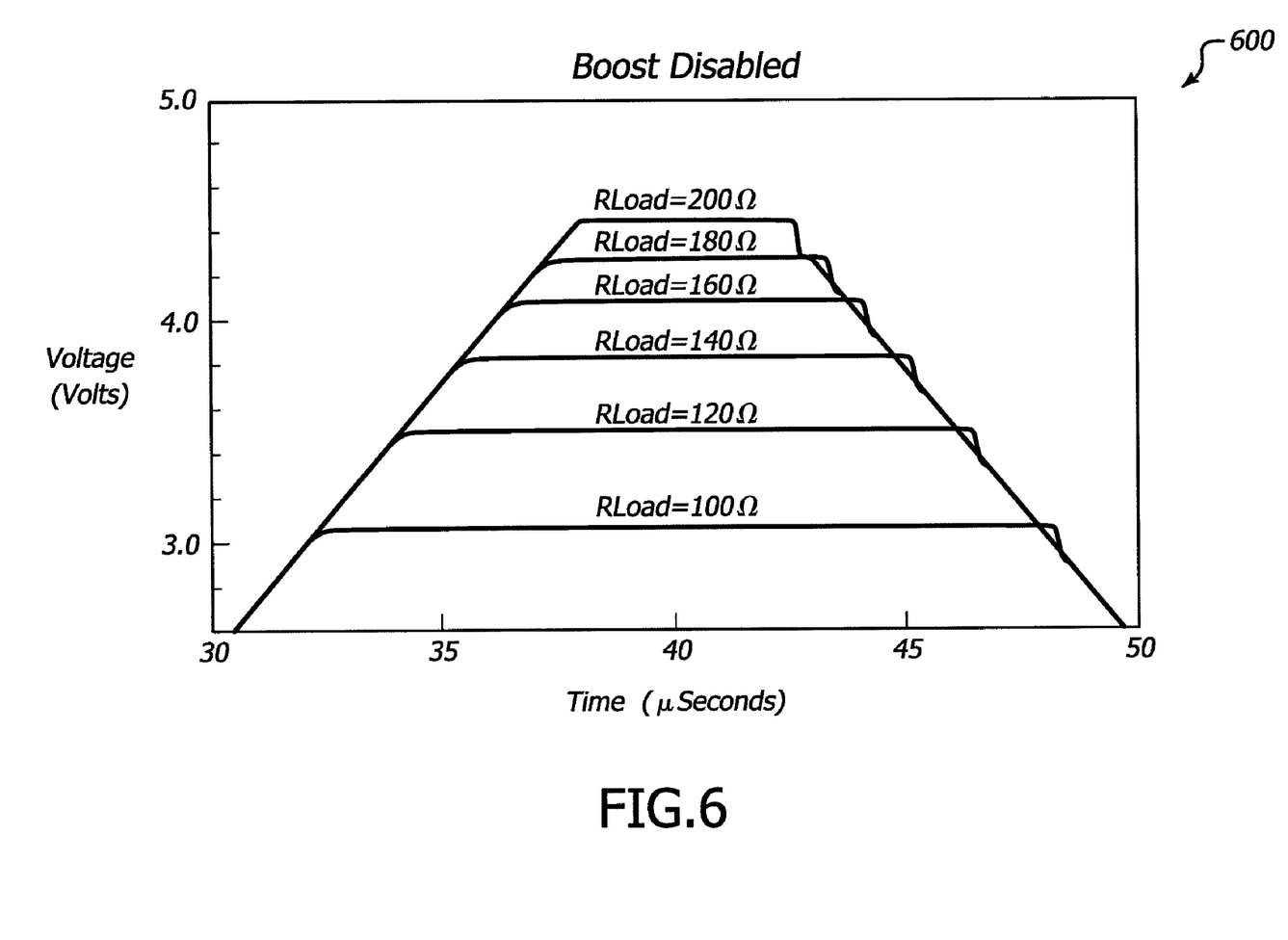
FIG. 6 is graphical diagram illustrating another performance of an example output stage circuit with extended output range when base current boosting is de-activated.

FIG. 6 is graphical diagram illustrating another performance of an example output stage circuit with extended output range when base current boosting is de-activated. As noted by the graph (500), the current reaches a maximum level as the effect of the load is increased from 200 ohms to 100 ohms in 20 ohm increments. For higher loading effects (i.e., lower values for load resistor RL corresponds to a higher loading effect), the clipping occurs at a lower current levels than that for reduced loading effects (i.e., higher values for load resistor RL).

Although the invention has been described herein by way of exemplary embodiments, variations in the structures and methods described herein may be made without departing from the spirit and scope of the invention. For example, the positioning of the various components may be varied. Individual components and arrangements of components may be substituted as understood to one of skill in the art having read the present disclosure. The various functions of circuits described herein may be separated or combined as required for a particular implementation. Therefore the described physical partitions of circuits and circuit components described herein may be varied to provide the same overall described functions. Since many embodiments of the invention can be made without departing from the spirit and scope of the invention, the invention resides in the claims hereinafter appended.

What is claimed is:

1. An output driver system that is responsive to a differential input signal to generate a drive current for an output transistor, wherein the output driver system is arranged to dynamically boost the drive current, the output driver system comprising:
   a differential amplifier block that is arranged to generate a first current (I1) in response to the differential input signal, wherein the first current (I1) has a first magnitude corresponding to a sum (I+S), wherein I corresponds to a DC current portion from the differential amplifier block and S corresponds to a signal varying portion from the differential amplifier block;

a first gain block that is arranged to generate a second current (I2) in response to the first current, wherein the second current (I2) has a second magnitude that is related to the first magnitude by a scaling factor;

a threshold detector block that is arranged to generate a control signal in response to a comparison between the first magnitude of the first current (I1) and a threshold level;

a second gain block that is arranged to generate a third current (I3) and that is responsive to the control signal, wherein the third current (I3) has a third magnitude, and wherein the second gain block is arranged such that the third current (I3) is approximately zero when the first magnitude of the first current (I1) is below the threshold level and non-zero when the first magnitude of the first current (I1) is above the threshold level;

a bias current block that is arranged to generate a nominal biasing current (IB) for the output transistor;

a current mirror block that is arranged to generate a fourth current (I4) having a fourth magnitude that is proportional to a difference (I−S) according to the scaling factor; and a summer block that is arranged to combine the nominal biasing current (IB), the second current (I2), the third current (I3), and the fourth current (I4) to generate a biasing current (IOUT) for the output transistor, wherein the summer block is arranged such that IOUT=IB+I2+I3−I4.

2. The output driver system of claim 1, wherein:
the scaling factor is denoted as W;
I2=W*(I+S);
I4=W*(I−S);and
IOUT=IB+I3+2*W*S.

3. The output driver system of claim 1, further comprising:

a second differential amplifier block that is arranged to generate a fifth current (I5) in response to the differential input signal, wherein the fifth current (I5) has a fifth magnitude corresponding to the difference (I−S);

a third gain block that is arranged to generate a sixth current (I6) in response to the fifth current, wherein the sixth current (I6) has a sixth magnitude that is related to the fifth magnitude by the scaling factor;

a second threshold detector block that is arranged to generate a second control signal in response to a comparison between the fifth magnitude of the fifth current (I5) and a second threshold level;

a fourth gain block that is arranged to generate a seventh current (I7) and that is responsive to the second control signal, wherein the seventh current (I7) has a seventh magnitude, and wherein the fourth gain block is arranged such that the seventh current (I7) is approximately zero when the fifth magnitude of the fifth current (I5) is below the second threshold level and non-zero when the fifth magnitude of the fifth current (I5) is above the second threshold level;

a second bias current block that is arranged to generate a second nominal biasing current (IB2) for a second output transistor;

a second current mirror block that is arranged to generate an eighth current (I8) that is proportional to the sum (I+S) according to the scaling factor; and a second summer block that is arranged to combine the second nominal biasing current (IB2), the sixth current (I6), the seventh current (I7) and the eighth current (I8) to generate a second biasing current (IOUT2) for the second output transistor, wherein the second summer block is arranged such that IOUT2=IB2+I6+I7−I8.

4. The output driver system of claim 3, wherein:
the scaling factor is denoted as W;
I6=W*(I−S);
I8=W*(I+S); and
IOUT2=IB2+I7−2*W*S.

5. An output driver circuit that is responsive to a differential input signal to generate drive currents for first and second output transistors, wherein the output driver circuit is arranged to dynamically boost the drive currents, the output driver circuit comprising:

a first current mirror circuit that includes a power terminal, a first output terminal arranged to provide a first current (IQ1), a second output terminal arranged to provide a second current (IQ2), and a sense terminal, wherein the first current mirror circuit is arranged to scale the first current (IQ1) according to a scaling factor (SF) relative to a third current (IQ3) sensed at the sense terminal of the first current mirror circuit, and wherein the first current mirror circuit is arranged to match the second current (IQ2) to the third current (IQ3);

a first amplifier circuit that includes a positive power terminal coupled to the first output terminal of the first current mirror circuit, a negative power terminal, an input terminal, and an output terminal, wherein the first amplifier circuit is arranged to receive a first portion of the differential input signal at its input terminal, and wherein the first amplifier circuit has a first DC biasing current corresponding to I;

a second amplifier circuit that includes a positive power terminal coupled to the sense terminal of the first current mirror circuit, a negative power terminal, an input terminal, and an output terminal, wherein the second amplifier circuit is arranged to receive a second portion of the differential input signal at its input terminal, and wherein the second amplifier circuit has a second DC biasing current also corresponding to I;

a resistor circuit that is coupled between the output terminals of the first and second amplifier circuits, wherein the resistor circuit is arranged to cooperate with the first amplifier circuit and the second amplifier circuit such that a current (S) flowing through the resistor circuit corresponds to a signal varying portion from the first and second amplifier circuits;

a second current mirror circuit that includes a power terminal, a first output terminal coupled to the negative power terminal of the first amplifier circuit and arranged to provide a fourth current (IQ4), a second output terminal arranged to provide a fifth current (IQ5), and a sense terminal coupled to the negative power terminal of the second amplifier circuit, wherein the second current mirror circuit is arranged to scale the fourth current (IQ4) according to the scaling factor (SF) relative to a sixth current (IQ6) sensed at the sense terminal of the second current mirror circuit, and wherein the second current mirror circuit is arranged to match the fifth current (IQ5) to the sixth current (IQ6);

a first drive circuit that includes a first current terminal coupled to the first output terminal of the first current mirror circuit, a second current terminal coupled to the second output terminal of the second current mirror circuit, and a third current terminal coupled to a first control terminal of the first output transistor, wherein the first drive circuit is arranged to drive the first control terminal with a first output current (IB7) that corresponds to IB7=IBP+SF*S+GP$_{(I+S)}$, where IBP is a first nominal biasing current for the first output transistor, and $GP_{(I+S)}$ is a first dynamically varied gain boost that is approximately zero when (I+S) is below a first threshold and non-zero when (I+S) is above the first threshold; and a second drive circuit that includes a first current terminal coupled to the first output terminal of the second current mirror circuit, a second current terminal coupled to the second output terminal of the first current mirror circuit, and a third current terminal coupled to a second control terminal of the second output transistor, wherein the second drive circuit is arranged to drive the second control terminal with a second output current (IB8) that corresponds to $IB8=IBN-SF*S+GN_{(I-S)}$, where IBN is a second nominal biasing current for the second output transistor, and $GN_{(I-S)}$ is a second dynamically varied gain boost that is approximately zero when (I−S) is below a second threshold and non-zero when (I−S) is above the second threshold.

6. The output driver circuit of claim 5, wherein:
the scaling factor (SF) corresponds to a value of two (2);
$IB7=IBP+4*S+GP_{(I+S)}$; and
$IB8=IBN-4*S+GN_{(I-S)}$.

7. The output drive circuit of claim 5, wherein the first current mirror circuit comprises:
a first bipolar junction transistor with an emitter coupled to the power terminal of the first current mirror circuit, a base coupled to the sense terminal of the first current mirror circuit and a collector coupled to the first output terminal of the first current mirror circuit;
a second bipolar junction transistor with an emitter coupled to the power terminal of the first current mirror circuit, a base coupled to the sense terminal of the first current mirror circuit, and a collector coupled to the second output terminal of the first current mirror circuit; and
a third bipolar junction transistor with an emitter coupled to the power terminal of the first current mirror circuit, a base coupled to the sense terminal of the first current mirror circuit, and a collector coupled to the sense terminal of the first current mirror circuit.

8. The output drive circuit of claim 5, wherein the first current mirror circuit comprises:
a first MOS transistor with a source coupled to the power terminal of the first current mirror circuit, a gate coupled to the sense terminal of the first current mirror circuit, and a drain coupled to the first output terminal of the first current mirror circuit;
a second MOS transistor with a source coupled to the power terminal of the first current mirror circuit first, a gate coupled to the sense terminal of the first current mirror circuit, and a drain coupled to the second output terminal of the first current mirror circuit; and
a third MOS transistor with a source coupled to the power terminal of the first current mirror circuit, a gate coupled to the sense terminal of the first current mirror circuit, and a drain coupled to the sense terminal of the first current mirror circuit.

9. The output drive circuit of claim 5, wherein the second current mirror circuit comprises:
a first bipolar junction transistor with an emitter coupled to the power terminal of the second current mirror circuit, a base coupled to the sense terminal of the second current mirror circuit, and a collector coupled to the first output terminal of the second current mirror circuit;
a second bipolar junction transistor with an emitter coupled to the power terminal of the second current mirror circuit, a base coupled to the sense terminal of the second current mirror circuit, and a collector coupled to the second output terminal of the second current mirror circuit; and
a third bipolar junction transistor with an emitter coupled to the power terminal of the second current mirror circuit, a base coupled to the sense terminal of the second current mirror circuit, and a collector coupled to the sense terminal of the second current mirror circuit.

10. The output drive circuit of claim 5, wherein the second current mirror circuit comprises:
a first MOS transistor with a source coupled to the power terminal of the second current mirror circuit, a gate coupled to the sense terminal of the second current mirror circuit, and a drain coupled to the first output terminal of the second current mirror circuit;
a second MOS transistor with a source coupled to the power terminal of the second current mirror circuit, a gate coupled to the sense terminal of the second current mirror circuit, and a drain coupled to the second output terminal of the second current mirror circuit; and
a third MOS transistor with a source coupled to the power terminal of the second current mirror circuit, a gate coupled to the sense terminal of the second current mirror circuit, and a drain coupled to the sense terminal of the second current mirror circuit.

11. The output drive circuit of claim 5, wherein the first drive circuit comprises a first biasing circuit that is arranged to generate the first nominal biasing current IBP, wherein the first biasing circuit comprises:
a current source coupled to a lower power terminal;
a first bipolar junction transistor with an emitter, a base coupled to the current source, and a collector coupled to the current source;
a second bipolar junction transistor with an emitter coupled to the third current terminal of the first drive circuit, a base coupled to the current source, and a collector coupled to the lower power terminal;
a third bipolar junction transistor with an emitter coupled to a higher power terminal, a base coupled to the emitter of the first bipolar junction transistor, and a collector coupled to the emitter of the first bipolar junction transistor; and
a fourth bipolar junction transistor with an emitter coupled to the higher power terminal, a base coupled to the emitter of the first bipolar junction transistor, and a collector coupled to the third current terminal of the first drive circuit.

12. The output driver circuit of claim 11, wherein the first bipolar junction transistor and the first output transistor are matched to one another according to a ratioed scaling factor.

13. The output drive circuit of claim 5, wherein the second drive circuit comprises a second biasing circuit that is arranged to generate the second nominal biasing current IBN, wherein the second biasing circuit comprises:
a current source coupled to a higher power terminal;
a first bipolar junction transistor with an emitter, a base coupled to the current source, and a collector coupled to the current source;
a second bipolar junction transistor with an emitter coupled to the third current terminal of the second drive circuit, a base coupled to the current source, and a collector coupled to the higher power terminal;
a third bipolar junction transistor with an emitter coupled to a lower power terminal, a base coupled to the emitter of the first bipolar junction transistor, and a collector coupled to the emitter of the first bipolar junction transistor; and a fourth bipolar junction transistor with an emitter coupled to the lower power terminal, a base coupled to the emitter of the first bipolar junction transistor, and a collector coupled to the third current terminal of the second drive circuit.

14. The output driver circuit of claim 13, wherein the first bipolar junction transistor and the second output transistor are matched to one another according to a ratioed scaling factor.

15. The output drive circuit of claim 5, wherein the first drive circuit comprises a threshold detector circuit that is arranged to selectively generate the first dynamically varied gain boost $GP_{(I+S)}$, the threshold detector circuit comprising:
a resistor that is coupled between the third current terminal of the first drive circuit and the second output terminal of the second current mirror circuit; and
a transistor that includes a first terminal coupled to the third current terminal of the first drive circuit, a second terminal coupled to a lower power terminal, and a control terminal coupled to the second output terminal of the second current mirror circuit, wherein the transistor is selectively activated in response to a voltage across the resistor.

16. The output drive circuit of claim 5, wherein the second drive circuit comprises a threshold detector circuit that is arranged to selectively generate the second dynamically varied gain boost $GN_{(I-S)}$, the threshold detector circuit comprising:
a resistor that is coupled between the third current terminal of the second drive circuit and the second output terminal of the first current mirror circuit; and
a transistor that includes a first terminal coupled to a higher power terminal, a second terminal coupled to the third current terminal of the second drive circuit, and a control terminal coupled to the second output terminal of the first current mirror circuit, wherein the transistor is selectively activated in response to a voltage across the resistor.

17. An output driver circuit that is responsive to a differential input signal to generate drive currents for first and second output transistors, wherein the output driver circuit is arranged to dynamically boost the drive currents to the output transistors, the output driver circuit comprising:
a first amplifier circuit that includes a first positive power terminal arranged to conduct a first amplifier positive supply current (IA1P=I+S), a first negative power terminal arranged to conduct a first amplifier negative supply current (IA1N=I−S), and a first input terminal arranged to receive a first portion of the differential input signal;
a second amplifier circuit that includes a second positive power terminal arranged to conduct a second amplifier positive supply current (IA2P=I−S), a second negative power terminal arranged to conduct a second amplifier negative supply current (IA2N=I+S), and a second input terminal arranged to receive a second portion of the differential input signal;
a resistor circuit that is coupled between output terminals of the first and second amplifier circuits and that is arranged to conduct an output current corresponding to S, where S corresponds to a signal varying current for the first and second amplifier circuits, and where I corresponds to a DC biasing current for the first and second amplifier circuits;
a first drive circuit that is arranged for driving a first control signal (IB7) to a first control terminal of the first output transistor and that is responsive to signals from the first positive power terminal and a first drive circuit input such that IB7=IBP+SF*S+$GP_{(I+S)}$, where IBP is a first nominal biasing signal for the first output transistor, SF is a scaling factor, and $GP_{(I+S)}$, is a first dynamically varied gain boost that is approximately zero when (I+S) is below a first threshold and non-zero when (I+S) is above the first threshold;
a second drive circuit that is arranged for driving a second control signal (IB8) to a second control terminal of the second output transistor and that is responsive to signals from the first negative power terminal and a second drive circuit input such that IB8=IBN−SF*S+$GN_{(I-S)}$, where IBN is a second nominal biasing current for the second output transistor, and $GN_{(I-S)}$ is a second dynamically varied gain boost that is approximately zero when (I−S) is below a second threshold and non-zero when (I−S) is above the second threshold;
a first transistor with a first terminal coupled to a positive power supply node, a control terminal coupled to the second positive power terminal, and a second terminal coupled to the first positive power terminal, wherein the first transistor is arranged to generate a current corresponding to SF*(I−S);
a second transistor with a first terminal coupled to the positive power supply node, a control terminal coupled to the second positive power terminal, and a second terminal coupled to the second drive circuit input, wherein the second transistor is arranged to generate a current corresponding to (I−S);
a third transistor with a first terminal coupled to the positive power supply node, a control terminal coupled to the second positive power terminal, and a second terminal coupled to the second positive power terminal, wherein the third transistor is arranged to sense a current corresponding to (I−S);
a fourth transistor with a first terminal coupled to a negative power supply node, a control terminal coupled to the second negative power terminal, and a second terminal coupled to the first negative power terminal, wherein the fourth transistor is arranged to generate a current corresponding to SF*(I+S);
a fifth transistor with a first terminal coupled to the negative power supply node, a control terminal coupled to the second negative power terminal, and a second terminal coupled to the first drive circuit input, wherein the fifth transistor is arranged to generate a current corresponding to (I+S); and
a sixth transistor with a first terminal coupled to the negative power supply node, a control terminal coupled to the second negative power terminal, and a second terminal coupled to the second negative power terminal, wherein the sixth transistor is arranged to sense a current corresponding to (I+S).

18. The output drive circuit of claim 17, wherein the first drive circuit comprises a threshold detector circuit that is arranged to selectively generate the first dynamically varied gain boost $GP_{(I+S)}$, the threshold detector circuit comprising:
a boost transistor that includes a first terminal coupled to the negative power supply node, a control terminal coupled to the first drive circuit input, and a second terminal coupled to the first control terminal of the first output transistor; and
a sense resistor circuit that is coupled between the first drive circuit input and the first control terminal of the first output transistor, wherein the sense resistor circuit is arranged to conduct a current corresponding to (I+S), and wherein the sense resistor circuit is arranged to selectively activate the boost transistor when a voltage across the sense resistor circuit exceeds a specified threshold.

19. The output drive circuit of claim 18, wherein the second drive circuit comprises a second threshold detector circuit that is arranged to selectively generate the second dynamically varied gain boost $GN_{(I-S)}$, the threshold detector circuit comprising:
- a second boost transistor that includes a first terminal coupled to the positive power supply node, a control terminal coupled to the second drive circuit input, and a second terminal coupled to the second control terminal of the second output transistor; and
- a second sense resistor circuit that is coupled between the second drive circuit input and the second control terminal of the second output transistor, wherein the second sense resistor circuit is arranged to conduct a current corresponding to (I−S), and wherein the second sense resistor circuit is arranged to selectively activate the second boost transistor when a voltage across the second sense resistor circuit exceeds a second specified threshold.

20. The output driver circuit of claim 17, wherein:
the first output transistor is scaled relative to a first biasing transistor in the first drive circuit; and
the second output transistor is scaled relative to a second biasing transistor in the second drive circuit.

21. An apparatus comprising:
a differential amplifier configured to generate a first current based on a differential input signal;
a first gain unit configured to generate a second current by applying a scaling factor to the first current;
a second gain unit configured to generate a third current that is approximately zero when a magnitude of the first current is below a threshold level and non-zero when the magnitude of the first current is above the threshold level;
a threshold detector configured to compare the magnitude of the first current and the threshold level and to control the second gain unit based on the comparison;
a current mirror configured to generate a fourth current based on the scaling factor;
a bias current generator configured to generate a fifth current comprising a nominal biasing current for an output transistor; and
a summer configured to generate a biasing current for the output transistor using the second, third, fourth, and fifth currents.

22. An apparatus comprising:
first and second amplifiers configured to amplify a differential input signal, each amplifier having positive and negative power terminals;
first and second drivers configured to drive first and second output transistors, respectively;
a first current mirror having a sense terminal coupled to the positive power terminal of the second amplifier, a first output terminal coupled to the positive power terminal of the first amplifier, and a second output terminal coupled to the second driver;
a second current mirror having a sense terminal coupled to the negative power terminal of the second amplifier, a first output terminal coupled to the negative power terminal of the first amplifier, and a second output terminal coupled to the first driver; and
a resistor coupled between output terminals of the first and second amplifiers.

23. The apparatus of claim 22, wherein:
the first driver is configured to drive a first control terminal of the first output transistor with a first current that is based on a first nominal biasing current for the first output transistor, a scaling factor, a current through the resistor, and a first dynamically varied gain boost; and
the second driver is configured to drive a second control terminal of the second output transistor with a second current that is based on a second nominal biasing current for the second output transistor, the scaling factor, the current through the resistor, and a second dynamically varied gain boost.

24. The apparatus of claim 22, wherein:
the first current mirror comprises:
- a first transistor with a first terminal coupled to a positive power supply node, a control terminal coupled to the positive power terminal of the second amplifier, and a second terminal coupled to the positive power terminal of the first amplifier;
- a second transistor with a first terminal coupled to the positive power supply node, a control terminal coupled to the positive power terminal of the second amplifier, and a second terminal coupled to the second driver; and
- a third transistor with a first terminal coupled to the positive power supply node, a control terminal coupled to the positive power terminal of the second amplifier, and a second terminal coupled to the positive power terminal of the second amplifier; and the second current mirror comprises:
- a fourth transistor with a first terminal coupled to a negative power supply node, a control terminal coupled to the negative power terminal of the second amplifier, and a second terminal coupled to the negative power terminal of the first amplifier;
- a fifth transistor with a first terminal coupled to the negative power supply node, a control terminal coupled to the negative power terminal of the second amplifier, and a second terminal coupled to the first driver; and
- a sixth transistor with a first terminal coupled to the negative power supply node, a control terminal coupled to the negative power terminal of the second amplifier, and a second terminal coupled to the negative power terminal of the second amplifier.

* * * * *